(12) United States Patent
Tailliet

(10) Patent No.: US 8,772,931 B2
(45) Date of Patent: Jul. 8, 2014

(54) DUAL-FUNCTION INTEGRATED CIRCUIT

(75) Inventor: François Tailliet, Fuveau (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 13/551,476

(22) Filed: Jul. 17, 2012

(65) Prior Publication Data
US 2013/0021093 A1 Jan. 24, 2013

(30) Foreign Application Priority Data

Jul. 22, 2011 (FR) ...................................... 11 56674

(51) Int. Cl.
H01L 23/48 (2006.01)
H03K 19/173 (2006.01)

(52) U.S. Cl.
USPC ............. 257/737; 257/778; 257/704; 326/37; 326/104

(58) Field of Classification Search
USPC .......... 327/564; 257/666, 704, 678, 737, 738, 257/778
See application file for complete search history.

(56) References Cited

U.S. PATENT DOCUMENTS

| 4,721,868 | A | 1/1988 | Cornell et al. | |
| 4,800,303 | A * | 1/1989 | Graham et al. | 326/72 |
| 6,060,901 | A * | 5/2000 | Davis | 326/37 |
| 6,515,505 | B1 | 2/2003 | Rees | |
| 6,580,288 | B1 | 6/2003 | Klapproth | |
| 6,939,747 | B1 * | 9/2005 | Lin | 438/130 |
| 2003/0176013 | A1 * | 9/2003 | Baker | 438/106 |
| 2003/0197263 | A1 | 10/2003 | Hwang et al. | |

OTHER PUBLICATIONS

French Search Report and Written Opinion dated Oct. 26, 2011 from corresponding French Application No. 11/56674.

* cited by examiner

*Primary Examiner* — Vibol Tan
(74) *Attorney, Agent, or Firm* — Wolf, Greenfield & Sacks, P.C.

(57) ABSTRACT

An electronic circuit in a package, including two functions, the package orientation activating a single one of the two functions.

17 Claims, 2 Drawing Sheets

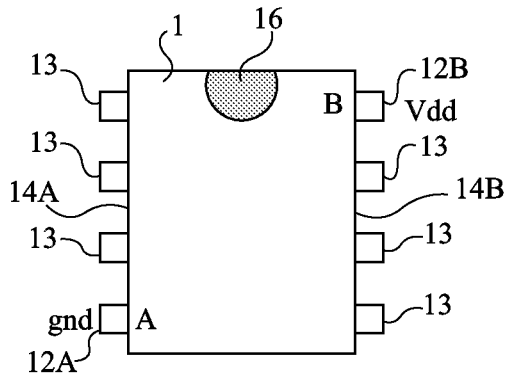
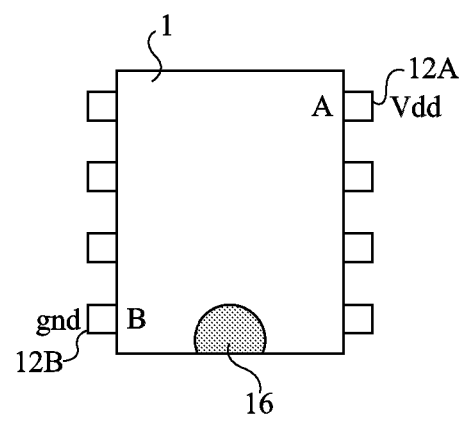
Fig 1A     Fig 1B
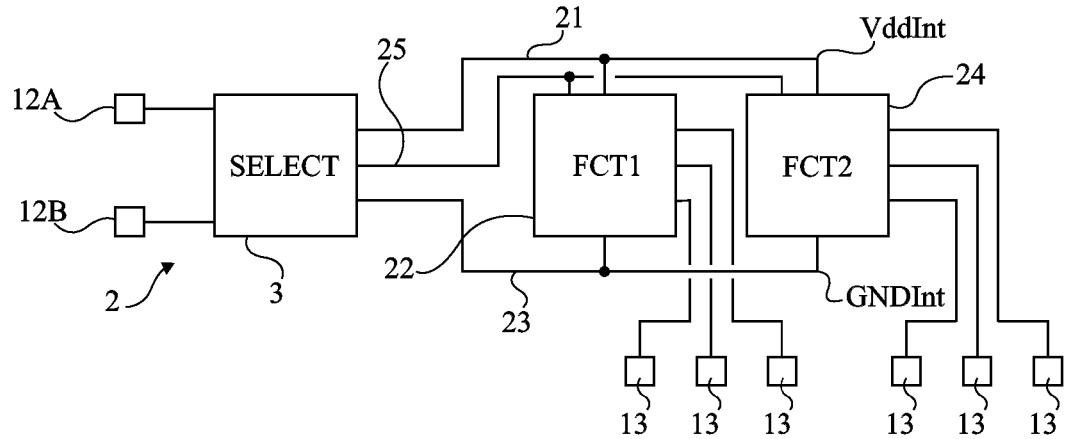
Fig 2
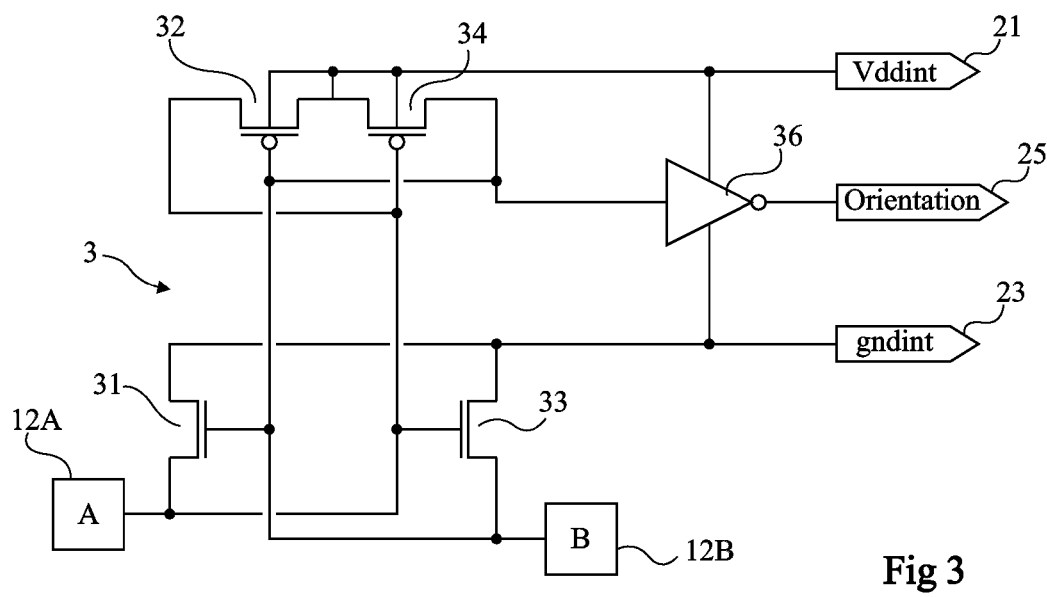
Fig 3

DUAL-FUNCTION INTEGRATED CIRCUIT

CROSS REFERENCE TO RELATED APPLICATIONS

This application claims the priority benefit of French patent application number 11/56674, filed on Jul. 22, 2011, which is hereby incorporated by reference to the maximum extent allowable by law.

BACKGROUND

1. Technical Field

Embodiments generally relate to electronic circuits and, more specifically, to integrated circuits housed in a package having connection tabs adapted to transfer contacts to other components or other circuits of an electronic device.

2. Discussion of the Related Art

Many electronic circuits, be they monolithic circuits, or digital or analog integrated circuits, are assembled in packages to then be assembled with other circuits or components on an electronic board, for example, a printed circuit.

The packages are generally made of resin or other insulating materials and comprise conductive contacting elements to transfer connections internal to the package to the outside, to establish connections with the other electronic board circuits.

The connection transfer elements may be conductive contact transfer tabs laterally coming out of the package, conductive bumps at the lower surface of the package to be transferred to corresponding conductive pads of the electronic board, etc.

As a result of the miniaturization of integrated circuits, the bulk of an electronic circuit is now due more to the package bulk than to the bulk associated with the electronic functions performed by the integrated circuit. This results in a loss of space in packages having a size, among others, conditioned by the elements of connection to the outside and the intervals to be left between these elements to provide an insulation between the different external connections.

It has already been provided to house, in a same package, several integrated circuits, or a circuit performing several functions, by selecting the function to be used by means of a dedicated external terminal. The circuit connection terminals (tabs or bumps) can then be configured to be assigned to one or the other function. Such a solution requires an additional terminal, which generates an increase of the package size due to its simple presence.

SUMMARY

An embodiment overcomes all or part of the disadvantages of known usual dual-function electronic circuits.

Another embodiment provides a packaged electronic circuit capable of performing two functions without for any external terminal to be necessary to select the chosen function.

Thus an embodiment provides an electronic circuit in a package, comprising two functions, the package orientation activating a single one of the two functions.

According to an embodiment, the circuit comprises, on each of two opposite sides of the package, a first terminal intended to receive a power supply voltage, the respective positions of the first two terminals being symmetrical with respect to the center of the segment connecting the first two terminals.

According to an embodiment, the circuit further comprises a selector of the activated function according to the direction of the power supply voltage applied between said first terminals.

According to an embodiment, said selector comprises:
two terminals of provision of a power supply voltage internal to the electronic circuit; and
a terminal for providing a signal indicative of the circuit orientation.

According to an embodiment, each first terminal is connected to one of said internal power supply terminals by a single MOS transistor.

According to an embodiment, second terminals are directly connected to one or the other of the functions.

According to an embodiment, second terminals are connected, via multiplexers, to said functions.

The foregoing and other features and advantages will be discussed in detail in the following non-limiting description of specific embodiments in connection with the accompanying drawings.

BRIEF DESCRIPTION OF THE DRAWINGS

FIGS. 1A and 1B are top views of an embodiment of a packaged electronic circuit in two orientations;

FIG. 2 is a block diagram of an embodiment of an electronic circuit;

FIG. 3 shows an embodiment of a selection circuit integrated to the electronic circuit;

DETAILED DESCRIPTION

Figure 4A:
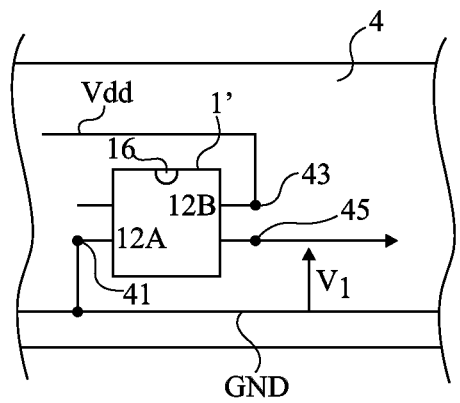
FIGS. 4A and 4B show an example of application of the circuit of FIGS. 1A and 1B.

The same elements have been designated with the same reference numerals in the different drawings. For clarity, only those elements which are useful to the understanding of the described embodiments have been shown and will be discussed. In particular, the implementation of the functions contained in the circuit has not been detailed, embodiments being compatible with usual integrated circuit manufacturing techniques. Further, the package manufacturing has not been detailed either, embodiments being here again compatible with usual manufacturing techniques.

FIGS. 1A and 1B show an embodiment of an electronic circuit in a package 1 in two assembly configurations. Package 1 integrates at least one integrated circuit (not shown in FIGS. 1A and 1B). Package 1 supports at least four (in the shown example, eight) contact transfer terminals or elements 12A, 12B, and 13. In the example of FIGS. 1A and 1B, it is assumed that these elements are tabs of electric connection to a printed circuit board, not shown. Among such tabs, two first tabs (tabs 12A and 12B) have a specific function. The two tabs are located on two opposite sides 14A and 14B of package 1. They are besides arranged in positions such that by pivoting package 1 by 180° (in the same plane, that is, without flipping it, the front surface remaining the front surface and the rear surface remaining the rear surface), tab 12A is in place of tab 12B and conversely. In other words, terminals 12A and 12B are, in the package plane, symmetrical with respect to the center of the segment (virtual line) joining terminals 12A and 12B.

In FIG. 1A, tab 12A is located, in the arbitrary orientation of the drawings, at the bottom left of the circuit and tab 12B is located at the top right, while in FIG. 1B, tab 12B is at the bottom left and tab 12A is at the top right. FIGS. 1A and 1B show two orientations, respectively designated with 0 and 1, of the package, the orientation of package 1 conditioning its operation.

As a variation, the first terminals may have other positions around the package (for example, in the middle of sides 14A and 14B), provided to respect the indicated symmetry.

Tabs 12A and 12B are intended to receive the power supply of the circuit(s) contained in the package, that is, they are intended to be connected either to a first positive or negative voltage (in the example, a positive voltage Vdd), or to ground (GND), or to a voltage of opposite sign. The direction (sign) of the D.C. voltage between terminals 12A and 12B, which is conditioned by the package orientation, in turn conditions the package function, that is, that of the two functions that it contains which is activated.

Preferably, to ease the assembly, a visual mark or guide 16 is provided on one of the surfaces of package 1 along one of its sides. This enables the operator or the machine for assembling packages on an electronic circuit board to determine the orientation to be given to the package according to the function to be activated. The example of FIG. 1 relates to a guide of the type provided in so-called DIL (Dual-in-Line) packages. The guides may be formed in many other ways, for example, a chamfer all along the edge of a package, a small hole in an angle, etc.

FIG. 2 is a block diagram of an embodiment of integrated circuit 2 contained in a package 1 of the type described in relation with FIGS. 1A and 1B.

Circuit 2 integrates two functions 22 (FCT1) and 24 (FCT2). These functions may be active, passive, of variable complexity, digital, analog, etc. The circuits contained in these functions are powered by rails 21 and 23, respectively at voltages VddInt and GNDInt corresponding to a D.C. internal power supply voltage, positive in the shown example. As a variation, this D.C. voltage is negative or bipolar (an additional terminal then directly providing the ground, if need be). Rails 21 and 23 are connected to output terminals of a selector 3 (SELECT) having as a function to transfer the voltages present on terminals 12A and 12B onto rails 21 and 23, according to the orientation given to package 1 when it is assembled, that is, according to the direction of the voltage between terminals 12A and 12B.

The other terminals 13 of package 1 are, in the example shown in FIG. 2, respectively assigned, for three of them, to function 22, and for the other three to function 24. Accordingly, in this example, according to the package assembly direction, three of tabs 13 are left floating, that is, are not connected to the electronic circuit board.

FIG. 3 is an electric diagram of an embodiment of selector 3 of FIG. 2. This selector is for example based on MOS transistors and has the function of automatically transferring, between terminals 21 and 23, the voltage applied between terminals 12A and 12B, in one direction or the other according to the circuit orientation.

Further, selector 3 provides a signal "Orientation" on a conductor 25. Signal Orientation is transmitted to circuits 22 and 24 to respectively activate/deactivate them according to the state of this signal.

Circuit 3 is based on a network of two N-channel transistors MOS 31 and 33 and of two to P-channel MOS transistors 32 and 34, cross connected. Transistor 31 directly connects terminal 12A to terminal 23. Transistor 33 directly connects terminal 12B to terminal 23. Transistor 34 directly connects terminal 12B to terminal 21. Transistor 32 directly connects terminal 12A to terminal 21. Further, the gates of transistors 31 and 32 are interconnected to terminal 12B and the gates of transistors 33 and 34 are interconnected to terminal 12A. The bulks of transistors 32 and 34 are interconnected to terminal 21. The bulks (not shown) of transistors 31 and 33 are interconnected to terminal 23.

The four MOS transistors 31 to 34 form a rectifying bridge, reducing voltage losses.

Signal Orientation is for example generated by means of an inverter 36 powered between terminals 21 and 23 and having its input directly connected to terminal 12B.

When external voltage Vdd is applied to terminal 12A and the ground is applied to terminal 12B, transistor 31 is blocked while transistor 33 is conductive (positive gate-source voltage). Further, transistor 34 is blocked and transistor 32 is conductive (negative gate-source voltage). As a result, voltage Vdd is transferred onto terminal 21 while the ground voltage is transferred onto terminal 23. Signal Orientation thus has a state 1 (inverter input at state 0).

Conversely, if external voltage Vdd is applied to terminal 12B and the external ground is applied to terminal 12A, transistors 31 and 34 are conductive and transistors 32 and 33 are blocked. As a result, terminal 12B is connected to terminal 21 and terminal 12A is connected to terminal 23. Signal Orientation has a state 0.

It should be noted that internal voltage VddInt is always applied in the same direction within the circuit. The difference of application direction from the outside conditions the function executed by the circuit.

Other embodiments of a selection circuit 3 can be envisaged. However, the embodiment shown in FIG. 3 has the advantage of generating no substantial voltage drop in crossing the selector, only ohmic losses being generated.

Figure 4B:
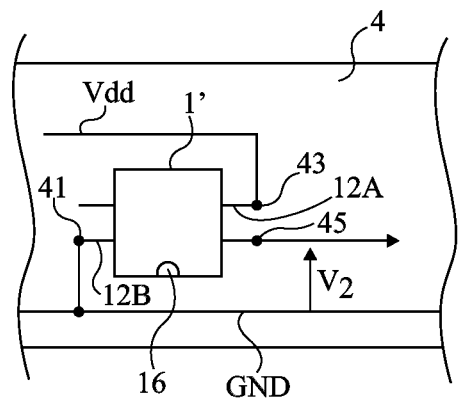

FIGS. 4A and 4B illustrate an example of application of an electronic circuit such as described by the above drawings to the generation of a power supply voltage having its value V1 or V2 depending on the circuit orientation.

Package 1' is assumed to only comprise four external connection tabs or terminals. Circuit 1' is assembled on a printed circuit board 4 which provides, at the location of package 1', three pads 41, 43, and 45 intended to be connected to three of the four tabs of package 1' according to its orientation. Pad 41 is connected to a ground conductor (GND) of board 4. Pad 43 is connected to a positive power supply conductor Vdd of board 4. Pad 45 provides to other circuits, not shown, of board 4 with a voltage V1 or V2 according to the orientation of package 1'.

In this example, functions 22 and 24 (FIG. 2) respectively are a voltage regulator providing level V1 and a voltage regulator providing level V2. Thus, according to the orientation given to circuit 1' on board 4, said circuit automatically provides one or the other of the two voltage levels.

Figure 5A:
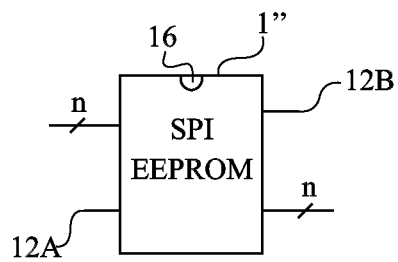
FIGS. 5A and 5B show another example of application of the circuit of FIGS. 1A and 1B.
Figure 5B:
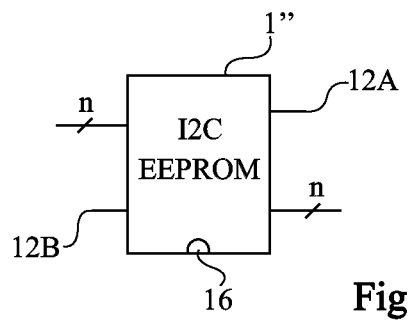

FIGS. 5A and 5B illustrate another example of application to an embodiment of a package 1" containing an EEPROM and its control circuits. In this example, package 1" comprises 2n+2 external connection terminals. n terminals on each side of the package are used to connect the signals associated with the application. For example, according to the orientation of package 1", said package is capable of communicating with the outside according to a protocol known as SPI or according to another protocol known as I2C. The actual nature of the protocol is of no importance. What is desired to be underlined herein is that the memory circuit is capable of operating according to one mode or another according to its orientation.

The examples of FIGS. 4A, 4B, 5A, and 5B illustrate cases where the functions performed by the package are of same nature. However, it may also be provided to integrate, in the same package, electronic circuits performing different functions.

Figure 6:
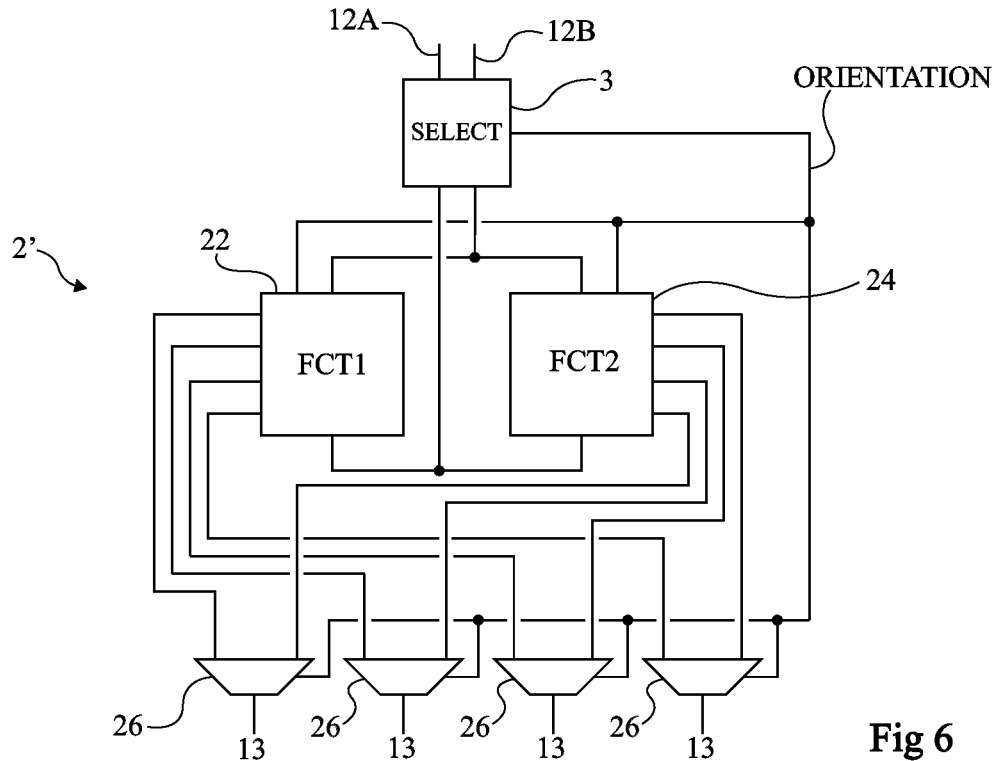
FIG. 6 is a block diagram of an alternative embodiment of the electronic circuit.

FIG. 6 is a block diagram of an alternative embodiment 2' of the circuits contained in the package. It shows the two functions (block 22, FCT1 and 24, FCT2) and selector 3 as in FIG. 2. However, it is here assumed that the other circuit terminals (in the example, 4) are all used whatever the activated function. As many two-to-one, one-to-two, or bidirectional multiplexers 16, according to the type of function performed by circuits 22 and 24, as there are terminals 13 are thus provided, to connect each terminal 13 to one of the corresponding terminals of blocks 22 and 24. Multiplexers 26 are controlled together by signal Orientation provided by selector 3.

It is now possible to take advantage of the discrepancy between the miniaturization of packages and the miniaturization of integrated circuits.

Another advantage of the described embodiments is that their implementation requires no additional terminal on the package to select its function.

The fact of using dual-function packages means a significant saving for integrated circuit manufacturers. Indeed, the additional cost due to the addition of a useless function in a package is negligible as compared with the cost generated by the inventory management and to logistics of two families of integrated circuits.

Various embodiments have been described, various alterations and modifications will occur to those skilled in the art. In particular, the implementation of the described embodiments is within the abilities of those skilled in the art based on the functional indications given hereabove. Similarly, the number of terminals depends on the application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic circuit in a package, comprising:
a first circuit in the package providing a first function; and
a second circuit in the package providing a second function different from the first function,
a first orientation of the package activating only the first circuit based on a first logical value, and
a second orientation of the package activating only the second circuit based on a second logical value.

2. The circuit of claim 1, comprising on each of two opposite sides of the package a first pair of terminals adapted to receive a power supply voltage, the respective positions of the first pair of terminals being symmetrical with respect to the center of the segment connecting the first pair of terminals.

3. The circuit of claim 1, further comprising a selector of the activated function according to the polarity of the power supply voltage applied between said first terminals.

4. The circuit of claim 3, wherein said selector comprises:
two terminals for providing a power supply voltage internal to the electronic circuit; and
a terminal for providing a signal indicative of the circuit orientation.

5. The circuit of claim 2, wherein each of the first pair of terminals is connected to a respective internal power supply terminal by a metal oxide semiconductor (MOS) transistor.

6. The circuit of claim 1, further comprising a plurality of terminals that are directly connected to one or the other of the functions.

7. The circuit of claim 1, further comprising a plurality of terminals that are connected, via multiplexers, to said functions.

8. An electronic circuit in a package comprising:
a first circuit in the package providing a first function; and
a second circuit in the package providing a second function different from the first function,
wherein a selector activates a single one of the two functions based on a logical value varying according to the polarity of the power supply voltage applied between two terminals of the electronic circuit, on two opposite sides of the package and having symmetrical positions with respect to the center of a segment connecting said two terminals.

9. The circuit of claim 1, wherein the package orientation is determined from a pin configured to receive a power supply voltage and not from a dedicated orientation detection pin.

10. The circuit of claim 1, further comprising three or more functions.

11. The circuit of claim 3, wherein each pin of the package is mapped to a function based on an output of the selector.

12. The circuit of claim 11, further comprising a multiplexer for mapping a pin to a function.

13. The circuit of claim 3, wherein the selector further comprises two N-channel transistors and two P-channel transistors.

14. The circuit of claim 3, wherein the selector further comprises a rectifying bridge coupled to an inverter.

15. The circuit of claim 1, wherein the two functions are a voltage regulator providing a first voltage level and a voltage regulator providing a second voltage level.

16. An orientation selector circuit for an electronic package, comprising:
a first terminal input directly connected to a first terminal of the electronic package;
a second terminal input directly connected to a second terminal of the electronic package;
a first output for outputting a power supply voltage;
a second output for outputting a ground voltage; and
a third output for outputting an orientation selector signal based on the first and second terminal inputs,
the orientation selector circuit being configured to allow a power supply voltage to be connected to either the first terminal input or the second terminal input.

17. An electronic circuit in a package comprising two functions, a selector and a multiplexer, wherein the selector activates one of the two functions according to a polarity of a power supply voltage applied between two terminals of the electronic circuit, and wherein the multiplexer connects a terminal to the activated one of the two functions.

* * * * *

UNITED STATES PATENT AND TRADEMARK OFFICE
CERTIFICATE OF CORRECTION

PATENT NO. : 8,772,931 B2  Page 1 of 1
APPLICATION NO. : 13/551476
DATED : July 8, 2014
INVENTOR(S) : François Tailliet It is certified that error appears in the above-identified patent and that said Letters Patent is hereby corrected as shown below:

In the Specification:

In column 5, line 26, the word "to" should be deleted.

Signed and Sealed this
Seventh Day of October, 2014

Michelle K. Lee
*Deputy Director of the United States Patent and Trademark Office*